(12) United States Patent
Hashimoto

(10) Patent No.: US 12,087,630 B2
(45) Date of Patent: Sep. 10, 2024

(54) CHIP MANUFACTURING METHOD

(71) Applicant: DISCO CORPORATION, Tokyo (JP)

(72) Inventor: Kazuki Hashimoto, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 486 days.

(21) Appl. No.: 17/647,061

(22) Filed: Jan. 5, 2022

(65) Prior Publication Data

US 2022/0238377 A1 Jul. 28, 2022

(30) Foreign Application Priority Data

Jan. 27, 2021 (JP) .................................. 2021-011030

(51) Int. Cl.
*H01L 21/78* (2006.01)
*H01L 21/268* (2006.01)
*H01L 21/304* (2006.01)

(52) U.S. Cl.
CPC ............ *H01L 21/78* (2013.01); *H01L 21/268* (2013.01); *H01L 21/3043* (2013.01)

(58) Field of Classification Search
CPC .... H01L 21/78; H01L 21/268; H01L 21/3043
See application file for complete search history.

(56) References Cited

U.S. PATENT DOCUMENTS

2008/0233712 A1* 9/2008 Sekiya ..................... H01L 24/83
257/E21.599

FOREIGN PATENT DOCUMENTS

| JP | 2007173475 A | 7/2007 |
| JP | 2009290052 A | 12/2009 |
| JP | 2013254867 A | 12/2013 |
| JP | 2020061459 A | 4/2020 |

OTHER PUBLICATIONS

Search report issued in counterpart Singapore patent application No. 10202114447R, dated Mar. 15, 2023.
Office Action issued in counterpart German patent application No. 10 2022 200 619.4, dated May 28, 2024.

* cited by examiner

*Primary Examiner* — Samuel A Gebremariam
(74) *Attorney, Agent, or Firm* — Greer Burns & Crain Ltd.

(57) ABSTRACT

A chip manufacturing method includes a modified layer forming step of forming a modified layer and a crack by applying, along planned dividing lines, a first laser beam having a wavelength transmitted through a substrate of a wafer including the substrate and a laminate in a state in which the back surface side of the substrate is exposed and a condensing point of the first laser beam is positioned within the substrate from the back surface side of the substrate, a grinding step of thinning the wafer to a predetermined thickness by grinding the back surface side of the substrate exposed in the modified layer forming step, and a laser-processed groove forming step of forming a laser-processed groove in the laminate by applying, along the planned dividing lines, a second laser beam having a wavelength absorbed by the substrate, from the front surface side of the wafer.

7 Claims, 14 Drawing Sheets

CHIP MANUFACTURING METHOD

BACKGROUND OF THE INVENTION

Field of the Invention

The present invention relates to a chip manufacturing method for manufacturing chips by dividing a wafer in which a substrate and a laminate are laminated.

Description of the Related Art

Semiconductor chips are generally manufactured by dividing a wafer along streets (planned dividing lines) set on a front surface of a substrate, the wafer including the substrate formed of a semiconductor such as silicon (Si) and a laminate of a Low-k film and a conductive layer or the like formed on the front surface of the substrate. Incidentally, a test element group (TEG) may be formed in partial regions of the laminate which regions are on the streets. In order to divide the wafer along the streets, laser-processed grooves are first formed along the streets by, for example, applying, along the streets, a pulsed laser beam having a wavelength absorbed by the substrate and the laminate. In the laser-processed grooves, the laminate is partly removed, so that the front surface of the substrate is exposed along the streets.

After the laser-processed grooves are formed, modified layers in which mechanical strength is decreased are formed within the substrate by moving a condensing point of a pulsed laser beam having a wavelength transmitted through the substrate and the wafer relative to each other along the streets in a state in which the condensing point is positioned within the substrate. Incidentally, at this time, cracks extending to the front surface side of the substrate with the modified layers as a starting point are also formed. After the modified layers are formed, the cracks are further extended by applying an external force to the wafer by grinding or the like. The wafer is thereby divided into a plurality of semiconductor chips (see Japanese Patent Laid-Open No. 2007-173475, for example).

However, when the laser-processed grooves are formed in the laminate, the front surface side of the substrate may be affected by a thermal effect of the laser beam, and consequently the crystal orientation of a partial region of the substrate which region is in proximity to a bottom portion of a processed groove may change. The extending direction of the cracks extending with the modified layers as a starting point depends on the crystal orientation of the substrate. Thus, when a change in the crystal orientation occurs, the cracks appear on the front surface of the substrate in such a manner as to avoid the laser-processed grooves, so that the wafer is not divided along the streets (that is, a processing defect occurs).

For this problem, a processing method in which laser-processed grooves are formed along the streets after the modified layers are formed, and the wafer is thereafter divided by grinding the back surface side of the substrate is conceivable. It is conceivable that, if this processing method is adopted, abnormal extension of the cracks due to a change in the crystal orientation can be suppressed. However, after the modified layers are formed with a back surface of the wafer exposed upward, the laser-processed grooves need to be formed with a front surface of the wafer exposed upward, and the substrate needs to be thereafter ground with the back surface of the wafer exposed upward again. Thus, work of inverting the wafer upside down needs to be performed at least twice during a period from the formation of the modified layers to the grinding. Productivity is consequently decreased.

SUMMARY OF THE INVENTION

The present invention has been made in view of such problems. It is an object of the present invention to divide a wafer reliably by suppressing abnormal extension of cracks when dividing the wafer having a laminate on the front surface of a substrate, and reduce the number of times of inverting the wafer upside down.

In accordance with an aspect of the present invention, there is provided a chip manufacturing method for manufacturing chips by dividing a wafer including a device formed in each region demarcated by a plurality of intersecting planned dividing lines set on a front surface of a substrate and a laminate formed at least on the plurality of planned dividing lines, the chip manufacturing method including a modified layer forming step of forming a modified layer along the planned dividing lines and forming a crack extending from the modified layer to a front surface side of the substrate by applying, along the planned dividing lines, a first laser beam having a wavelength transmitted through the substrate, in a state in which a back surface side of the substrate is exposed and a condensing point of the first laser beam is positioned within the substrate from the back surface side of the substrate, a grinding step of thinning the wafer to a predetermined thickness by grinding the back surface side of the substrate exposed in the modified layer forming step, after the modified layer forming step, and a laser-processed groove forming step of forming a laser-processed groove in the laminate by applying, along the planned dividing lines, a second laser beam having a wavelength absorbed by the substrate, from a front surface side of the wafer, after the grinding step.

In the laser-processed groove forming step, the laser-processed groove may be formed in such a manner as to cover the crack extending from the modified layer to the front surface side of the wafer.

In the laser-processed groove forming step, the laser-processed groove may be formed in such a manner as not to divide the laminate completely. In the laser-processed groove forming step, the laser-processed groove may be formed in such a manner as to divide the laminate completely.

In the modified layer forming step, the crack extending to the front surface side of the wafer may be formed in such a manner as not to sever the laminate. In the modified layer forming step, the crack extending to the front surface side of the wafer may be formed in such a manner as to sever the laminate.

The chip manufacturing method may further include a tape affixing step of affixing a tape having elasticity to the back surface side of the substrate, after the grinding step but before the laser-processed groove forming step, and an expanding step of expanding the tape affixed to the back surface side of the substrate, after the laser-processed groove forming step.

The chip manufacturing method according to one aspect of the present invention performs the modified layer forming step and the grinding step in order in a state in which the back surface side is exposed, and further performs the laser-processed groove forming step in a state in which the front surface side is exposed, after the grinding step. Thus, the number of times of inversion of the wafer in a period from the modified layer forming step to the laser-processed groove forming step can be reduced to one. In addition, because the laser-processed groove forming step is performed after the modified layer forming step, abnormal extension of the crack due to a change in crystal orientation can be suppressed. It is therefore possible to reduce the number of times that the wafer is inverted upside down, and reliably divide the wafer having the laminate on the front surface of the substrate, along the planned dividing lines.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
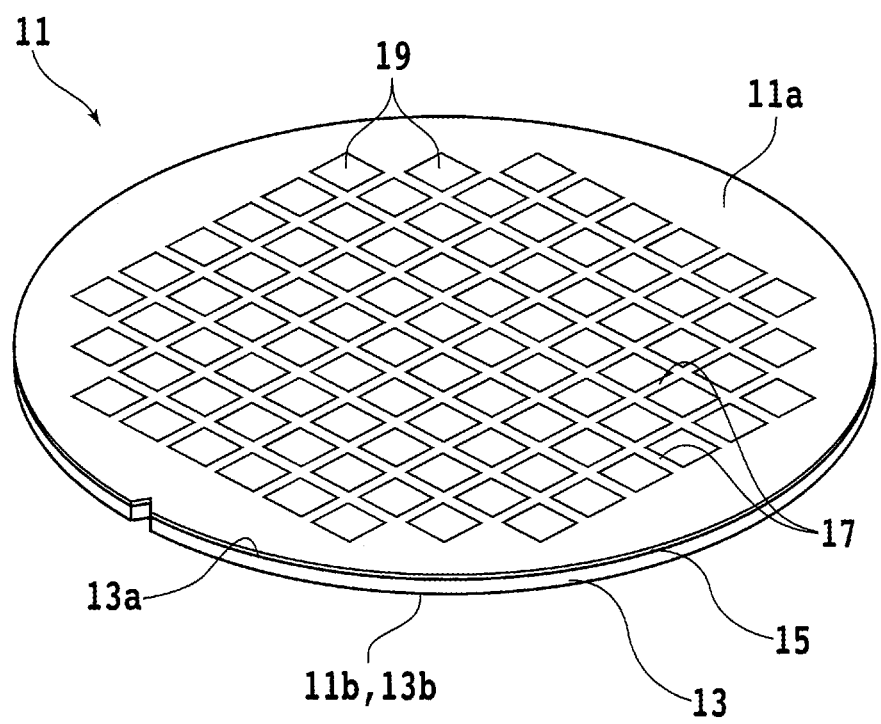
FIG. 1 is a perspective view of a wafer.

Embodiments according to one aspect of the present invention will be described with reference to the accompanying drawings. FIG. 1 is a perspective view of a wafer 11 to be processed. The wafer 11 includes a substantially disk-shaped substrate 13. The substrate 13 is formed by a semiconductor material such as Si. It is to be noted that there are no limitations on the material, shape, structure, size, and the like of the substrate 13. For example, the substrate 13 may be formed by another semiconductor material (GaAs, InP, GaN, or the like) or a material such as sapphire, glass, ceramic, resin, or a double oxide ($LiNbO_3$ or $LiTaO_3$).

The diameter of the substrate 13 in the present example is approximately 300 mm (12 inches). The thickness of the substrate 13 from a front surface 13a to a back surface 13b is approximately 700 μm. However, the diameter and thickness of the substrate 13 are not limited to those in the present example. A plurality of planned dividing lines (streets) 17 are set in a lattice manner on the front surface 13a of the substrate 13. A device 19 such as an integrated circuit (IC) is formed in each of regions demarcated by the planned dividing lines 17 intersecting one another. The external shape of the device 19 in the present example is a rectangular shape of 4 mm×5 mm. However, there are no limitations on the kind, quantity, shape, structure, size, and the like of the device 19.

A laminate 15 including a low dielectric constant insulator layer (insulating layer formed of what is generally called a Low-k material) and a conductive layer formed of metal is formed on the front surface 13a of the substrate 13. The thickness of the laminate 15 is, for example, approximately a few micrometers, and is sufficiently thin as compared with the thickness of the substrate 13 that has not yet been processed. The laminate 15, including the planned dividing lines 17, is formed on the whole of the front surface 13a. Regions of the laminate 15 in which regions the devices 19 are formed protrude more than regions in which the planned dividing lines 17 are set.

Figure 2:
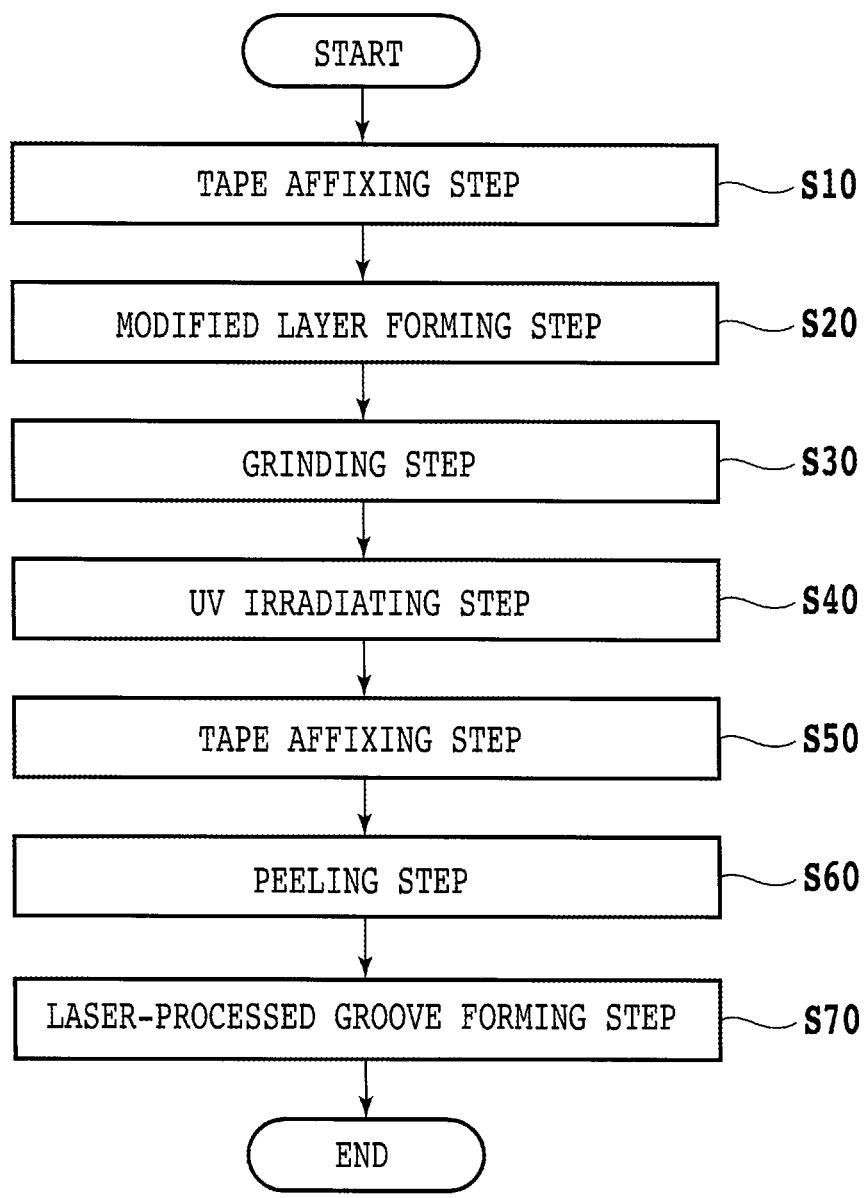
FIG. 2 is a flowchart of a chip manufacturing method according to a first embodiment.

Description will next be made of a method of manufacturing a plurality of device chips (chips) 35 (see FIG. 9A and the like) by dividing the wafer 11 into units of the devices 19. FIG. 2 is a flowchart of a method of manufacturing the device chips 35 according to a first embodiment. First, a first protective tape 21 is affixed to the laminate 15 side of the wafer 11 (that is, a front surface 11a of the wafer 11) and one surface of an annular frame 23 (see FIG. 3) made of metal which annular frame has an opening portion of a diameter larger than that of the wafer 11 (tape affixing step S10).

In the present example, a wafer unit 25 is formed in which the wafer 11 is thus supported by the annular frame 23 via the first protective tape 21. However, the annular frame 23 is not essential. The first protective tape 21 having substantially the same diameter as that of the wafer 11 may be affixed to the front surface 11a side. The first protective tape 21 is, for example, a resin-made film in which a glue layer (adhesive layer) is provided on a base material layer formed of resin. In the present example, the base material layer is formed of a polyolefin resin, and the adhesive layer is formed of an ultraviolet (UV) curable resin.

Figure 3:
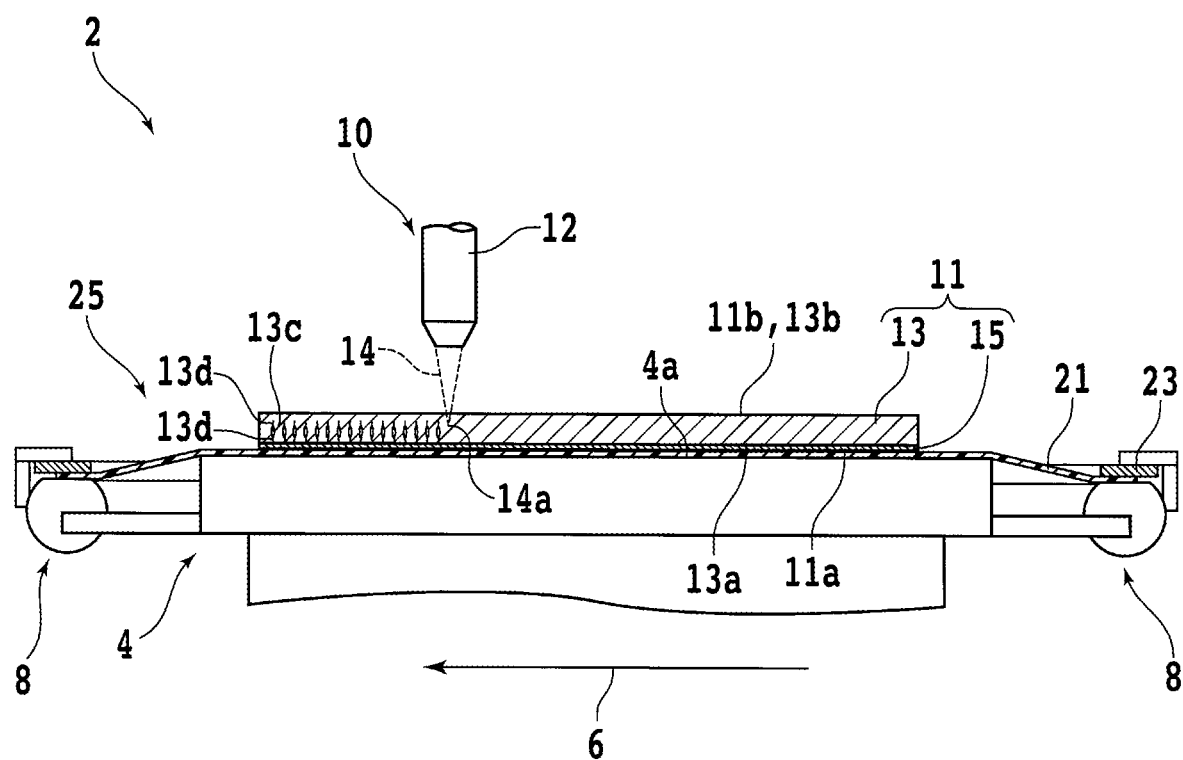
FIG. 3 is a partially sectional side view depicting a modified layer forming step.

After the tape affixing step S10, modified layers 13c are formed in the substrate 13 by using a first laser processing apparatus 2 (modified layer forming step S20). The first laser processing apparatus 2 depicted in FIG. 3 is used in the modified layer forming step S20. The first laser processing apparatus 2 includes a disk-shaped chuck table 4 having a circular holding surface 4a that holds the front surface 11a side of the wafer 11 under suction. The chuck table 4 includes a disk-shaped frame body and a disk-shaped porous plate (not depicted) having a diameter smaller than that of the frame body.

A negative pressure from a suction source such as an ejector acts on the porous plate via a flow passage (not depicted) formed in the frame body. The chuck table 4 is configured to be rotatable about a predetermined rotational axis. The rotation of the chuck table 4 is performed by a rotational driving source (not depicted) that rotates a base member on which the chuck table 4 is mounted. In addition, the chuck table 4 is configured to be movable along a processing feed direction 6 and an indexing feed direction orthogonal to the processing feed direction 6 in a horizontal plane. Movement in the processing feed direction 6 is performed by an X-axis direction moving mechanism of a ball screw type. Movement in the indexing feed direction is performed by a Y-axis direction moving mechanism of a ball screw type.

On the side of the chuck table 4, a plurality of clamp mechanisms 8 are provided along the circumferential direction of the chuck table 4. A head section 12 of a laser beam irradiating unit 10 is provided above the holding surface 4a. The laser beam irradiating unit 10 includes a laser oscillator (not depicted) and the head section 12 including a condensing lens (not depicted). A pulsed laser beam (first laser beam) 14 having a wavelength transmitted through the substrate 13 is applied from the head section 12 toward the holding surface 4a.

In the modified layer forming step S20, first, the front surface 11a side of the wafer 11 is held under suction by the holding surface 4a, and the annular frame 23 is held by each clamp mechanism 8. At this time, a back surface 11b of the wafer 11 (that is, the back surface 13b of the substrate 13) is exposed upward. Then, an offset of the planned dividing lines 17 with respect to the processing feed direction 6 (what is generally called a θ offset) is corrected by rotating the chuck table 4 as appropriate. Next, a condensing point 14a of the laser beam 14 and the chuck table 4 are moved relative to each other along the processing feed direction 6 in a state in which the condensing point 14a is positioned at a predetermined depth within the substrate 13 from the back surface 13b side of the substrate 13. In the modified layer forming step S20, processing conditions are set as follows, for example, and the wafer 11 is processed.

Wavelength of the laser beam: 1064 nm
Average power: 1 W
Pulse repetition frequency: 100 kHz
Processing feed speed: 800 mm/s
Distance from the condensing point to the front surface of the substrate: 70 μm
Number of pass(es): 1

Incidentally, the number of pass(es) means the number of time(s) that the laser beam 14 is applied along one planned dividing line 17. However, the number of passes may be set to two or more, and two or more modified layers 13c may be formed at different depth positions closer to the front surface 13a side than the back surface 13b. For example, it is preferable to set the number of passes to three, and form three modified layers 13c at different depth positions closer to the front surface 13a side than the back surface 13b. In addition, a distance from the condensing point 14a to the front surface 13a of the substrate 13 (that is, a distance from the modified layer 13c to the front surface 13a) is adjusted as appropriate in such a manner as to be larger than a finished thickness of the substrate 13. For example, in a case where the finished thickness of the substrate 13 is 50 μm, the distance from the modified layer 13c to the front surface 13a of the substrate 13 is adjusted to 70 μm or the like.

After the modified layer 13c is formed along one planned dividing line 17, the chuck table 4 is indexing-fed by a predetermined length in the indexing feed direction, and a modified layer 13c is similarly formed along another planned dividing line 17 adjacent to the one planned dividing line 17. After modified layers 13c are formed along all of the planned dividing lines 17 along one direction, the chuck table 4 is rotated by 90 degrees by the rotational driving source, and modified layers 13c are similarly formed along all of the planned dividing lines 17 along another direction orthogonal to the one direction. The modified layers 13c refer to regions of mechanical strength lower than that of regions in which no modified layer 13c is formed in the substrate 13. In the modified layer forming step S20, when the modified layers 13c are formed, cracks 13d extend from the modified layers 13c to the front surface 13a side and the back surface 13b side.

Figure 4A:
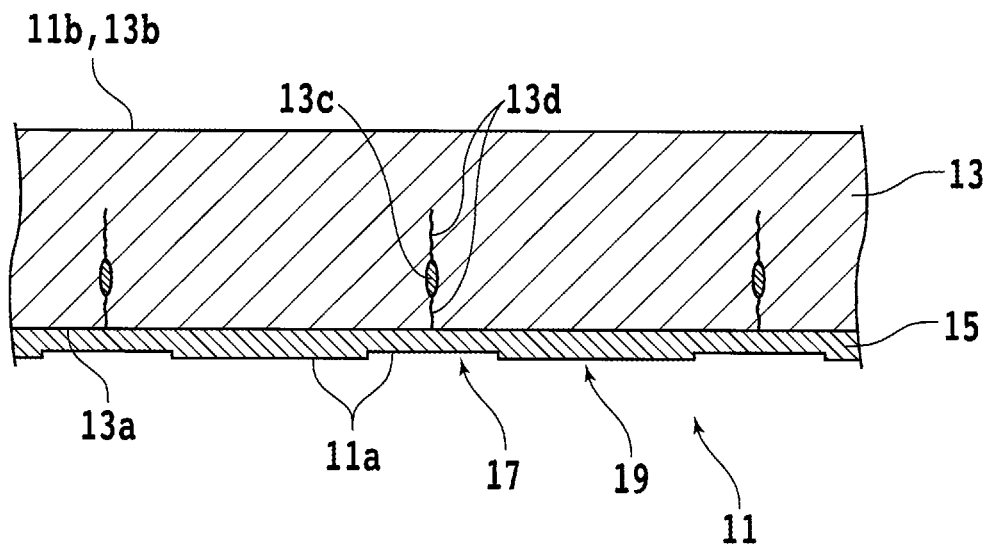
FIG. 4A is an enlarged sectional view of the wafer, the enlarged sectional view depicting an example of cracks.

FIG. 4A is an enlarged sectional view of the wafer 11, the enlarged sectional view depicting an example of the cracks 13d formed by performing the modified layer forming step S20 according to the above-described processing conditions. In the example depicted in FIG. 4A, the cracks 13d reach the front surface 13a of the substrate 13, but do not sever the laminate 15. In a case where the cracks 13d do not sever the laminate 15 as mentioned above, the wafer 11 is not divided into the individual device chips 35, and therefore movement of the device chips 35 does not occur at a time of a tape affixing step S50 to be described later. Incidentally, the same is true for a case where the cracks 13d do not sever the laminate 15 and the extension of the cracks 13d is stopped within the laminate 15. When the movement of the device chips 35 does not occur, intervals between the device chips 35 are uniform, and there is thus an advantage in that a laser-processed groove forming step S70 to be described later is performed easily as compared with a case where the intervals between the device chips 35 vary due to the movement of the device chips 35.

Figure 4B:
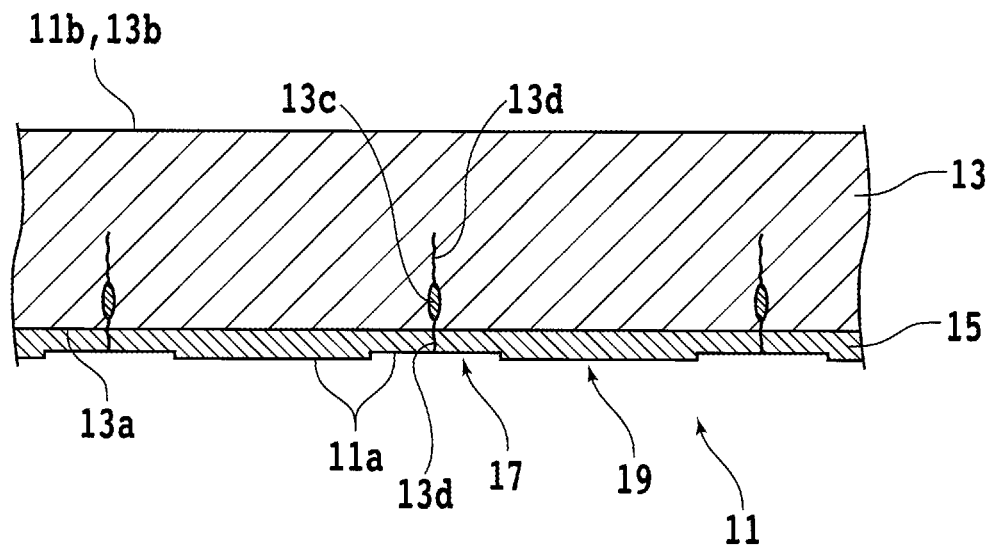
FIG. 4B is an enlarged sectional view of the wafer, the enlarged sectional view depicting another example of the cracks.

However, the cracks 13d may be formed in the laminate 15, and the laminate 15 may be divided by the cracks 13d, by application of one or a plurality of the following: increasing at least one of pulse energy and repetition frequency; bringing the condensing point 14a close to the front surface 13a; and decreasing processing feed speed, for example. For example, as depicted in FIG. 4B, the laminate 15 can be divided by the cracks 13d by forming the modified layers 13c at a position further closer to the front surface 11a side than in the above-described example. This provides an advantage of being able to divide the wafer 11 more reliably. FIG. 4B is an enlarged sectional view of the wafer 11, the enlarged sectional view depicting another example of the cracks 13d. Incidentally, in the examples depicted in FIG. 4A and FIG. 4B, the cracks 13d do not reach the back surface 11b (that is, the back surface 13b).

Figure 5:
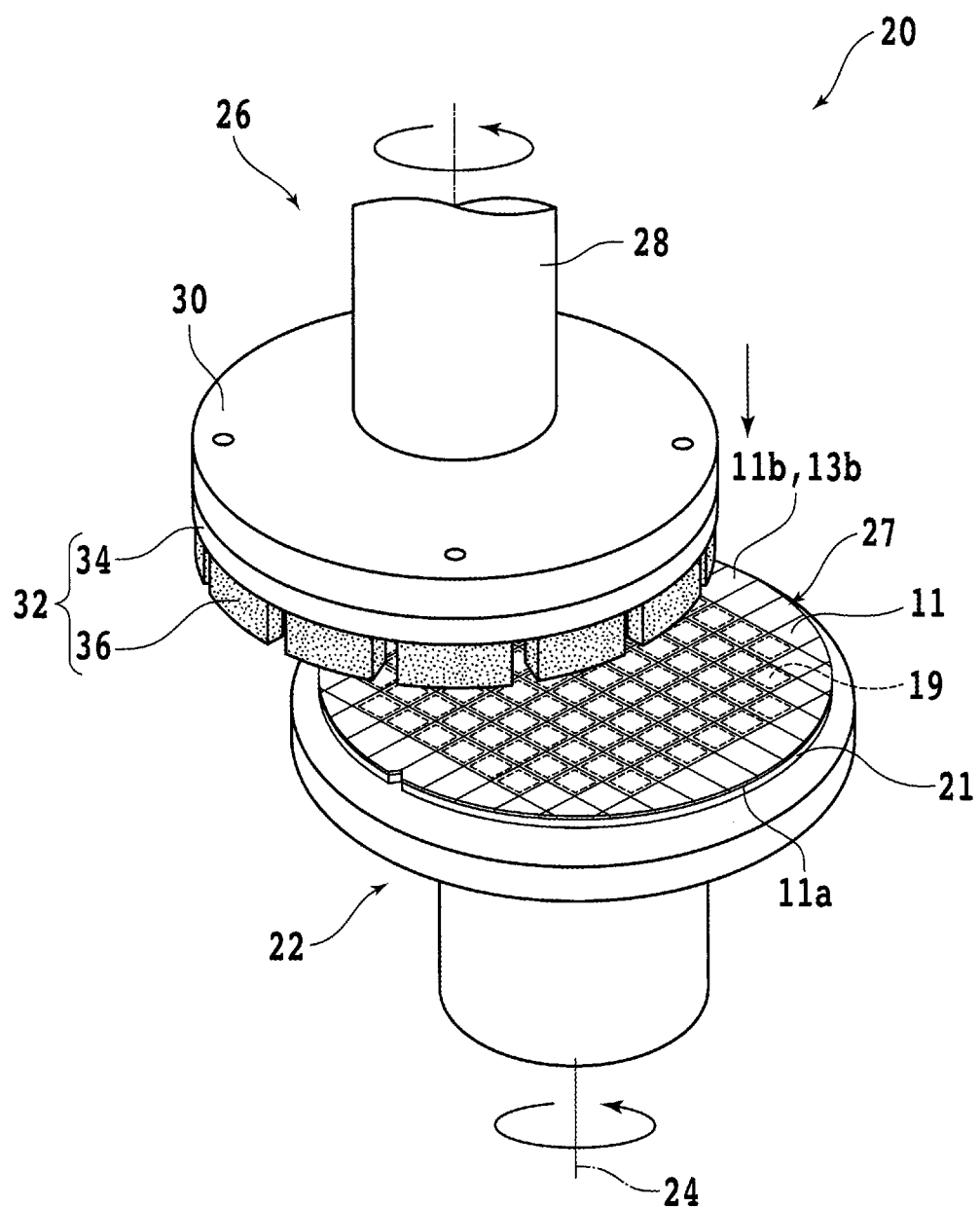
FIG. 5 is a perspective view depicting a grinding step.

After the modified layer forming step S20, the back surface 11b side exposed in the modified layer forming step S20 is ground, an external force is applied to the back surface 11b side, and the wafer 11 is thinned to a predetermined finished thickness (grinding step S30). A grinding apparatus 20 depicted in FIG. 5 is used in the grinding step S30. The grinding apparatus 20 includes a disk-shaped chuck table 22. The chuck table 22 has a structure similar to that of the above-described chuck table 4. Repeated description of the chuck table 22 will therefore be omitted.

A rotational driving source (not depicted) is coupled to a lower portion of the chuck table 22, and the chuck table 22 is rotated at high speed about a predetermined rotational axis 24. A grinding unit 26 is provided above a holding surface of the chuck table 22. The grinding unit 26 includes a cylindrical spindle 28. An upper end portion of the spindle 28 is provided with a motor (not depicted). A lower end portion of the spindle 28 is provided with a disk-shaped mounter 30.

An annular grinding wheel 32 is coupled to a lower surface of the mounter 30. The grinding wheel 32 includes an annular wheel base 34 made of metal. A plurality of grinding stones 36 are fixed to the bottom surface side of the wheel base 34 along the circumferential direction of the wheel base 34. The grinding stones 36 are, for example, formed by mixing abrasive grains of diamond, cubic boron nitride (cBN), or the like in a binding material of metal, ceramic, resin, or the like. FIG. 5 is a perspective view depicting the grinding step S30. Before the grinding step S30 is performed, however, the first protective tape 21 is first cut out along the contour of the wafer 11 without the wafer unit 25 being inverted upside down, and a wafer unit 27 of the wafer 11 and the first protective tape 21 is thereby formed. Incidentally, the first protective tape 21 does not need to be cut out in a case where the annular frame 23 is not used in the tape affixing step S10.

Figure 6A:
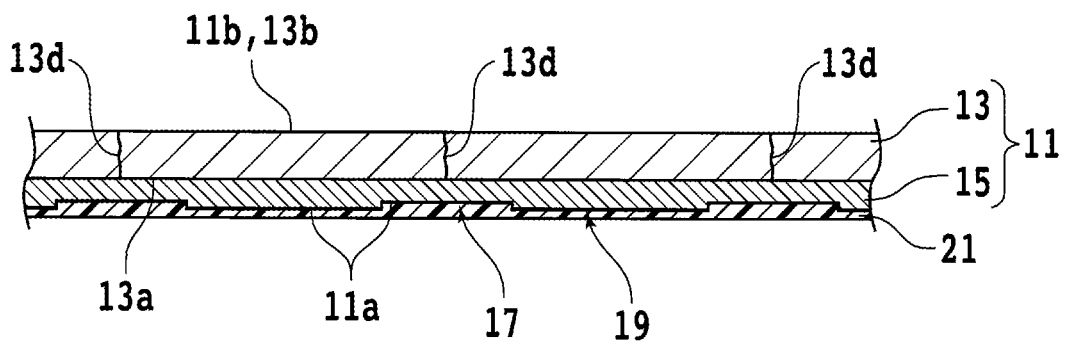
FIG. 6A is an enlarged sectional view depicting an example of the wafer obtained after the grinding step.

Next, in the grinding step S30, the grinding unit 26 is grinding-fed downward at a predetermined grinding feed speed (for example, 0.5 μm/s) in a state in which the front surface 11a side is held under suction by the chuck table 22, the chuck table 22 is rotated at a high speed (for example, 100 rpm), and further, the grinding wheel 32 is rotated at a predetermined speed (for example, 3000 rpm) while grinding water such as pure water is supplied to a processing point. Consequently, the back surface 13b side is ground, and the substrate 13 is thinned to a predetermined finished thickness (for example, approximately 50 μm). FIG. 6A is an enlarged sectional view depicting an example of the wafer 11 obtained after the grinding step S30.

Figure 6B:
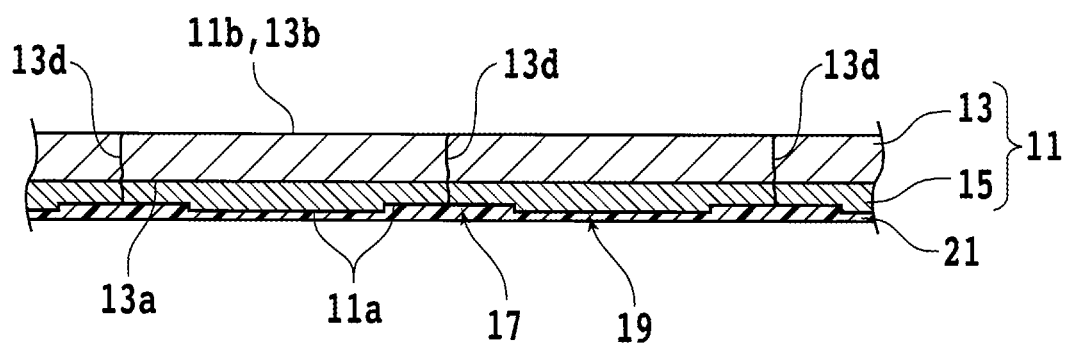
FIG. 6B is an enlarged sectional view depicting another example of the wafer obtained after the grinding step.

The external force applied to the wafer 11 in the grinding step S30 causes the cracks 13d to extend to the front surface 13a and the back surface 13b of the substrate 13, and, for example, as depicted in FIG. 6A, each crack 13d continues from the front surface 13a to the back surface 13b. Incidentally, in a case where the cracks 13d are already formed also in the laminate 15 (see FIG. 4B) or in a case where the external force applied to the wafer 11 in the grinding step S30 is relatively large, the cracks 13d may continue from the front surface 11a to the back surface 11b of the wafer 11 (see FIG. 6B). FIG. 6B is an enlarged sectional view depicting another example of the wafer 11 obtained after the grinding step S30.

After the grinding step S30, the wafer 11 is transported to a tape reaffixing apparatus (not depicted). The tape reaffixing apparatus performs a UV irradiating step S40 and a tape affixing step S50 to be described later. The tape reaffixing apparatus includes a UV irradiating unit. The UV irradiating unit includes a table formed of a transparent material that transmits UV. A UV lamp is disposed below the table.

In the UV irradiating step S40 after the grinding step S30, first, the wafer 11 is transported onto the table while the front surface 11a side of the wafer 11 remains oriented downward. Then, the adhesive force of the first protective tape 21 is decreased by irradiating the first protective tape 21 with UV. The tape reaffixing apparatus includes an affixing unit that affixes a second protective tape 29 to the wafer 11 or the like; and a cutting-out unit for cutting out the second protective tape 29 affixed to the wafer 11 or the like into a circular shape. The cutting-out unit includes an arm and a cutting blade provided to a distal end portion of the arm.

After the UV irradiating step S40, in a state in which an annular frame 31 made of metal which annular frame has a diameter larger than that of the wafer 11 is disposed on the periphery of the wafer 11, the affixing unit affixes the second protective tape 29 to one surface of the annular frame 31 and the back surface 11b side of the wafer 11 (tape affixing step S50). Next, the cutting-out unit cuts out the second protective tape 29 into a predetermined diameter. The tape reaffixing apparatus further includes an inversion moving unit that vertically inverts the wafer 11 and a peeling unit for peeling the first protective tape 21. The wafer 11 having the second protective tape 29 affixed to the back surface 11b side is vertically inverted by the inversion moving unit, and is transported to a holding table of the peeling unit.

Figure 7:
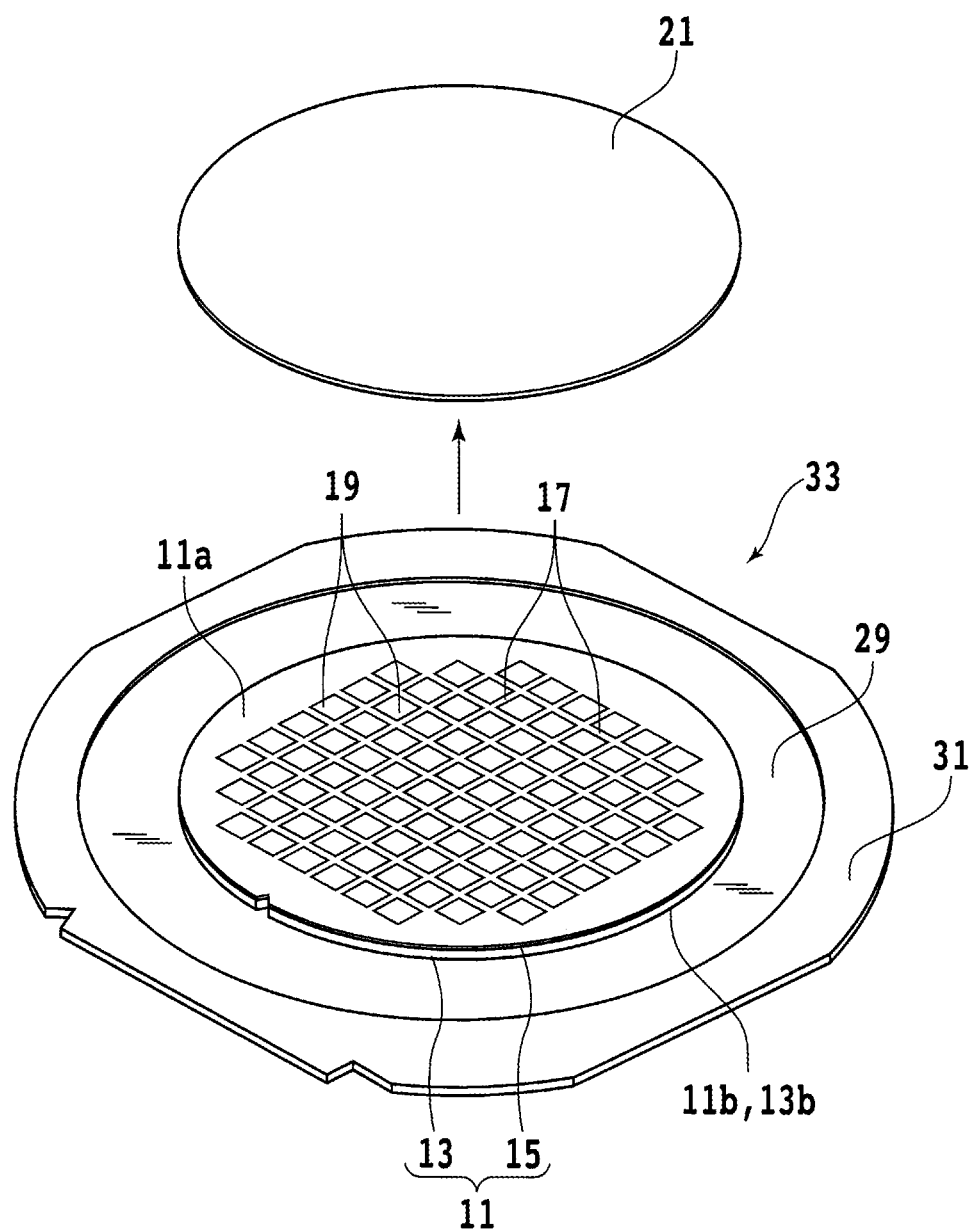
FIG. 7 is a diagram depicting an outline of a peeling step.

Consequently, the first protective tape 21 is exposed upward, and the second protective tape 29 is held under suction by the holding table. Then, the peeling unit peels off the first protective tape 21 whose adhesive force is decreased in the UV irradiating step S40 (peeling step S60). Thus, the wafer 11 is transferred from the first protective tape 21 to the second protective tape 29, and a wafer unit 33 (see FIG. 7) in which the wafer 11 is supported by the annular frame 31 via the second protective tape 29 is formed. FIG. 7 is a diagram depicting an outline of the peeling step S60. Incidentally, as with the first protective tape 21, the second protective tape 29 is a resin-made film in which a glue layer (adhesive layer) is provided on a base material layer formed of resin. However, the second protective tape 29 is a film having elasticity, in particular.

Figure 8:
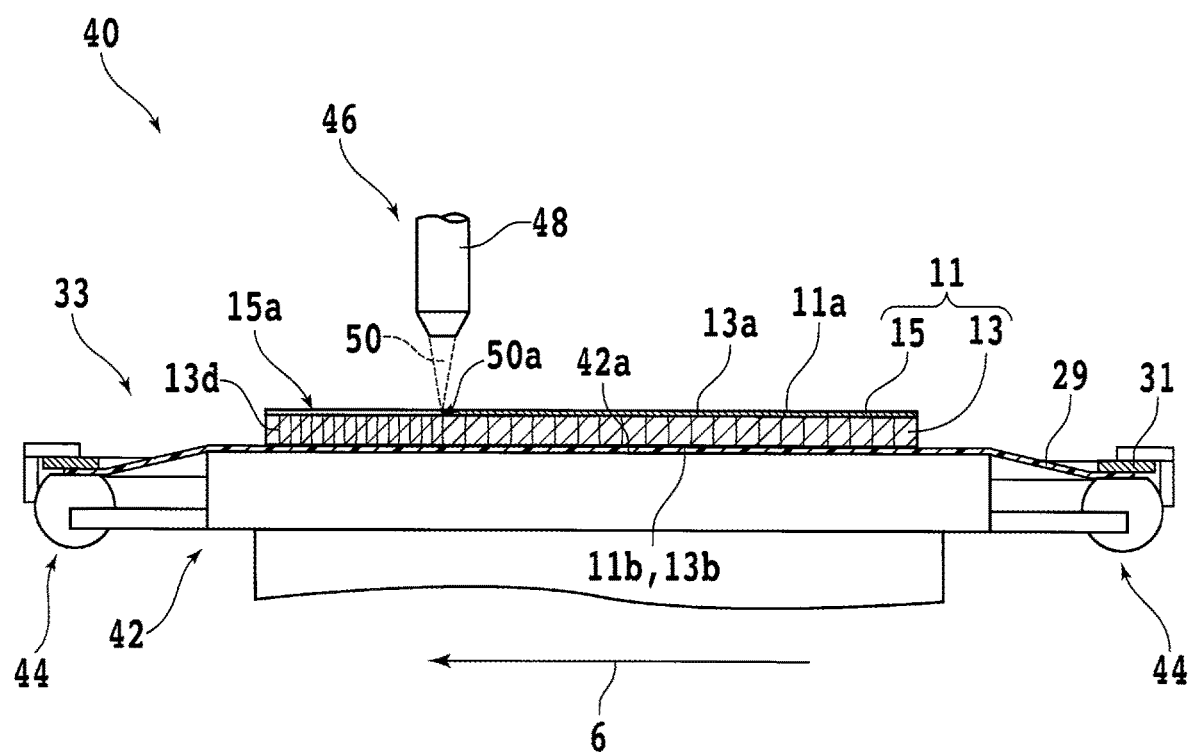
FIG. 8 is a partially sectional side view depicting a laser-processed groove forming step.

After the peeling step S60, a laser-processed groove forming step S70 which forms a laser-processed groove 15a (see FIG. 8) along each planned dividing line 17 is performed. A second laser processing apparatus 40 depicted in FIG. 8 is used in the laser-processed groove forming step S70. The second laser processing apparatus 40 includes a chuck table 42 similar to the chuck table 4 and clamp mechanisms 44 similar to the clamp mechanisms 8. Incidentally, a rotational driving source, an X-axis direction moving mechanism, a Y-axis direction moving mechanism, and the like are provided as in the first laser processing apparatus 2. A head section 48 of a laser beam irradiating unit 46 is provided above a holding surface 42a.

The laser beam irradiating unit 46 includes a laser oscillator (not depicted) and the head section 48 including a condensing lens (not depicted). A pulsed laser beam (second laser beam) 50 having a wavelength absorbed by the substrate 13 and the laminate 15 is applied from the head section 48 toward the holding surface 42a. The laser beam 50 has an intensity distribution close to a Gaussian distribution in a plane perpendicular to the optical axis of the condensing lens in the laser beam irradiating unit 46.

When the laser-processed groove forming step S70 is to be performed, first, a coating and cleaning apparatus (not depicted) is used to apply a water-soluble resin formed of polyvinyl alcohol or the like to the whole of the front surface 11a side, and thereby form a protective film (not depicted). Next, the back surface 11b side of the wafer 11 is held under suction by the holding surface 42a of the second laser processing apparatus 40, and the annular frame 31 is held by each clamp mechanism 44. Incidentally, at this time, the front surface 11a of the wafer 11 is exposed upward.

Then, after an offset of the planned dividing lines 17 with respect to the processing feed direction 6 is corrected by rotating the chuck table 4, a condensing point 50a of the laser beam 50 and the chuck table 4 are moved relative to each other along the processing feed direction 6 in a state in which the condensing point 50a is positioned at the front surface 11a. FIG. 8 is a partially sectional side view depicting the laser-processed groove forming step S70. In the laser-processed groove forming step S70, processing conditions are set as follows, for example, and the wafer 11 is processed.

Wavelength of the laser beam: 355 nm
Average power: 2 W
Pulse Repetition frequency: 200 kHz
Processing feed speed: 400 mm/s
Number of pass(es): 1

Figure 9A:
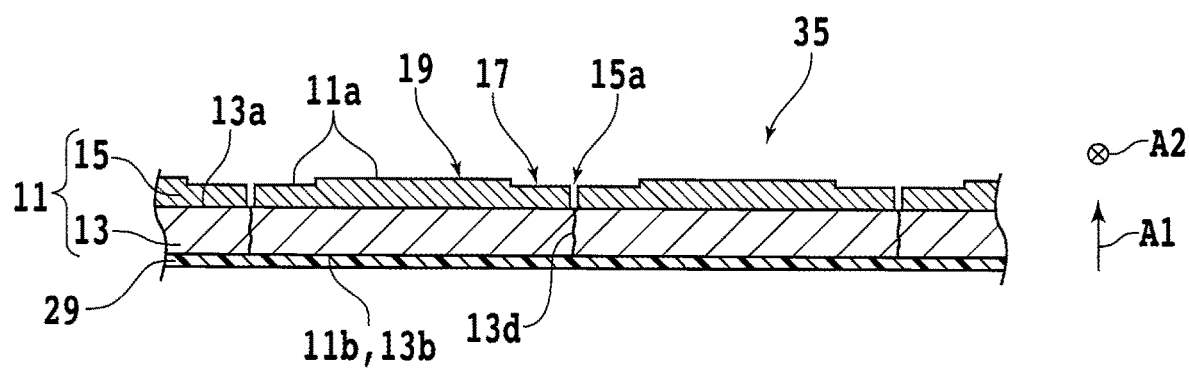
FIG. 9A is an enlarged sectional view of the wafer, the enlarged sectional view depicting laser-processed grooves.

Next, the condensing point 50a is positioned at the front surface 11a in such a manner as to be superimposed on a region irradiated with the laser beam 14 in the modified layer forming step S20 in a thickness direction A1 (see FIG. 9A) of the wafer 11, and the laser beam 50 is applied along each planned dividing line 17. Laser-processed grooves 15a are thereby formed. FIG. 9A is an enlarged sectional view of the wafer 11, the enlarged sectional view depicting an example of the laser-processed grooves 15a.

The laminate 15 is ablation-processed, so that a laser-processed groove 15a in which the laminate 15 is removed (that is, the laminate 15 is completely severed) from the front surface 11a of the wafer 11 to the front surface 13a of the substrate 13 is formed along each planned dividing line 17 in the laminate 15. After laser-processed grooves 15a are formed along all of the planned dividing lines 17, the coating and cleaning apparatus is used again to clean the protective film by pure water or the like together with debris produced during the laser processing, and thereafter dry the protective film. A plurality of device chips 35 obtained by dividing the wafer 11 along the plurality of planned dividing lines 17 are thus formed.

In the present embodiment, the modified layer forming step S20 and the grinding step S30 are performed in a state in which the back surface 11b side is exposed, and after the grinding step S30, the laser-processed groove forming step S70 is performed in a state in which the front surface 11a side is exposed. Thus, the number of times of inversion of the wafer 11 in a period from the modified layer forming step S20 to the laser-processed groove forming step S70 can be reduced to one. In addition, because the laser-processed groove forming step S70 is performed after the modified layer forming step S20, abnormal extension of the cracks 13d due to a change in crystal orientation of the substrate 13 can be suppressed. It is therefore possible to reduce the number of times that the wafer 11 is inverted upside down, and reliably divide the wafer 11 having the laminate 15 on the front surface 13a of the substrate 13, along the planned dividing lines 17.

Incidentally, the cracks 13d may meander in the thickness direction A1 of the substrate 13 and an extending direction A2 of the planned dividing lines 17. If a crack 13d appearing on the front surface 13a is present in a region different from a bottom portion of the laser-processed groove 15a, the laser-processed groove 15a and the crack 13d may not be connected to each other. Accordingly, the width of the laser-processed groove 15a (width in a direction orthogonal to the extending direction A2 of the planned dividing line 17 in a plane substantially parallel with the back surface 11b) may be made wider than a meandering width of the crack 13d appearing on the front surface 13a.

Figure 9B:
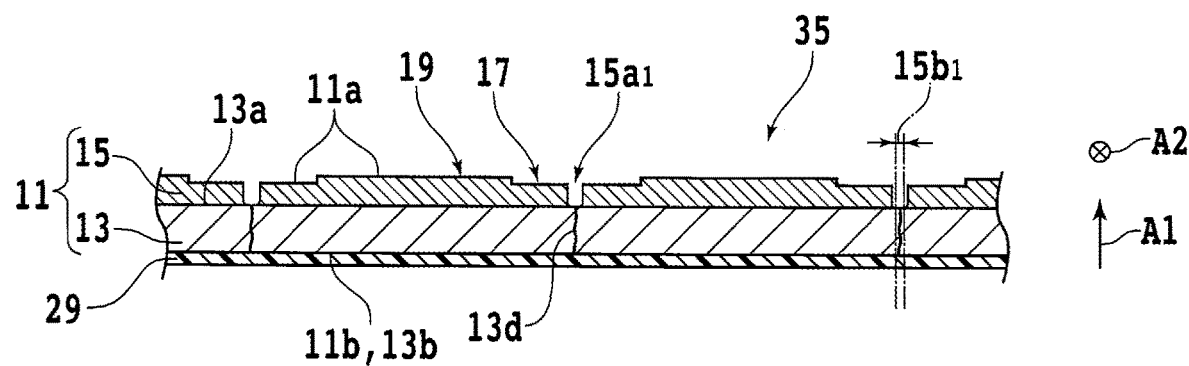
FIG. 9B is an enlarged sectional view of the wafer, the enlarged sectional view depicting laser-processed grooves having a sufficiently large width.

(First Modification) FIG. 9B is an enlarged sectional view of the wafer 11, the enlarged sectional view depicting a laser-processed groove $15a_1$ that is superimposed on the crack 13d in the thickness direction A1 and has a width $15b_1$ sufficiently wider than the meandering width of the crack 13d. Incidentally, the laser-processed groove $15a_1$ completely severs the laminate 15. While the laser-processed groove 15a depicted in FIG. 9A can also cover the crack 13d appearing on the front surface 13a, the laser-processed groove $15a_1$ depicted in FIG. 9B can sufficiently cover the crack 13d appearing on the front surface 13a, so that the laser-processed groove $15a_1$ and the crack 13d can be connected to each other more reliably.

(Second Modification) In the foregoing example, a laser-processed groove 15a is formed by applying the laser beam 50 once along one planned dividing line 17. However, the laser beam 50 may be applied a plurality of times. For example, the laser beam 50 having an intensity distribution similar to a Gaussian distribution as in the cases of forming the laser-processed grooves 15a and $15a_1$ is branched into two by using a diffractive optical element or the like, and two condensing points 50a are applied along one planned dividing line 17.

Figure 10A:
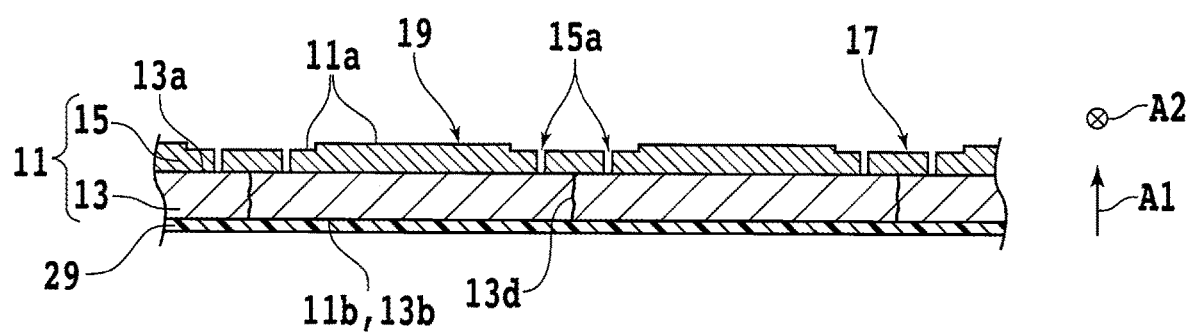
FIG. 10A is an enlarged sectional view of the wafer, the enlarged sectional view depicting two laser-processed grooves.
Figure 10B:
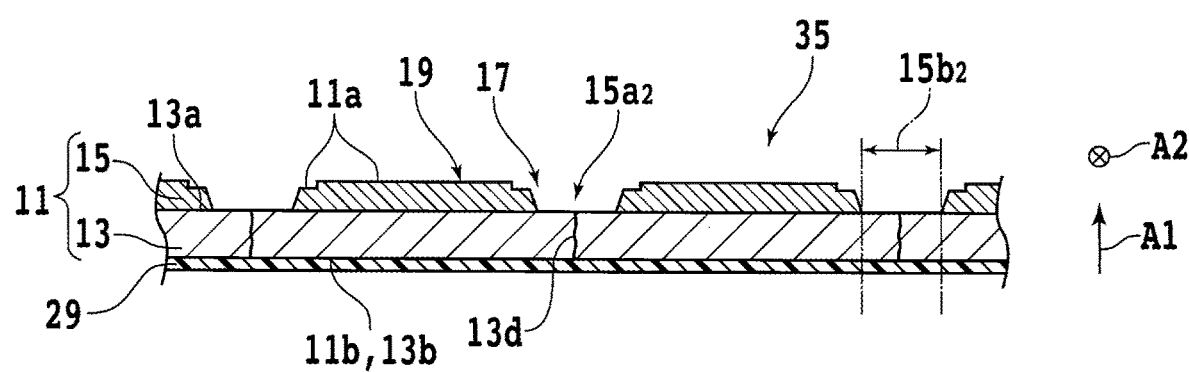
FIG. 10B is an enlarged sectional view of the wafer, the enlarged sectional view depicting wide laser-processed grooves.

Two laser-processed grooves 15a that completely sever the laminate 15 along each planned dividing line 17 are thus formed. FIG. 10A is an enlarged sectional view of the wafer 11, the enlarged sectional view depicting the two laser-processed grooves 15a formed by applying a first laser beam 50. Next, the laminate 15 remaining between the two laser-processed grooves 15a is irradiated with a laser beam 50 (what is generally called a top-hat beam) that has a substantially uniform intensity distribution in the plane perpendicular to the optical axis of the condensing lens and that is wider than the first laser beam 50. FIG. 10B is an enlarged sectional view of the wafer 11, the enlarged sectional view depicting a wide laser-processed groove $15a_2$ formed by applying the second laser beam 50.

The second modification has an advantage of being able to solve, by forming the two relatively narrow laser-processed grooves 15a, a problem that the laminate 15 in the vicinity of a planned dividing line 17 is split and peeled, what is generally called delamination. Incidentally, because a width $15b_2$ of the laser-processed groove $15a_2$ is wider than that of the crack 13d, there is also an advantage of being able to connect the laser-processed groove $15a_2$ and the crack 13d to each other reliably.

Figure 11A:
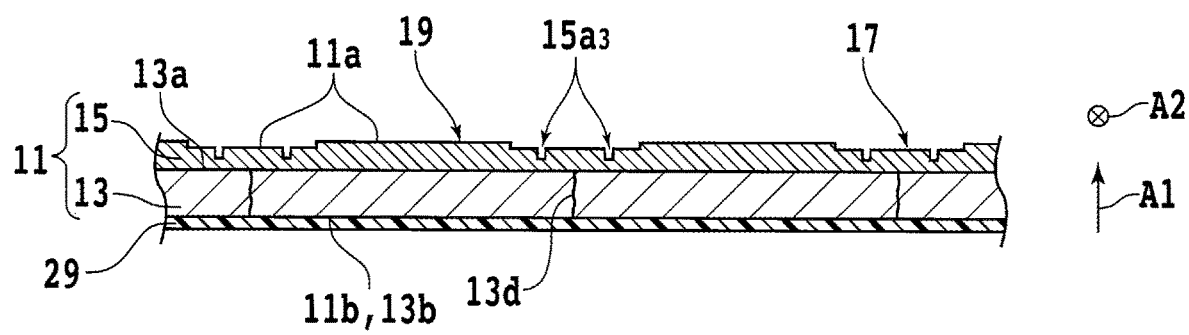
FIG. 11A is an enlarged sectional view of the wafer, the enlarged sectional view depicting laser-processed grooves in a first stage.

(Third Modification) Incidentally, the laminate 15 does not necessarily have to be severed completely in the application of the first laser beam 50. For example, in the application of the first laser beam 50, two shallow laser-processed grooves $15a_3$ not severing the laminate 15 are formed. FIG. 11A is an enlarged sectional view of the wafer 11, the enlarged sectional view depicting two shallow laser-processed grooves $15a_3$. In the application of the second laser beam 50 following the first laser beam 50, the laser-processed groove $15a_2$ is formed by applying the above-described top-hat beam.

Figure 11B:
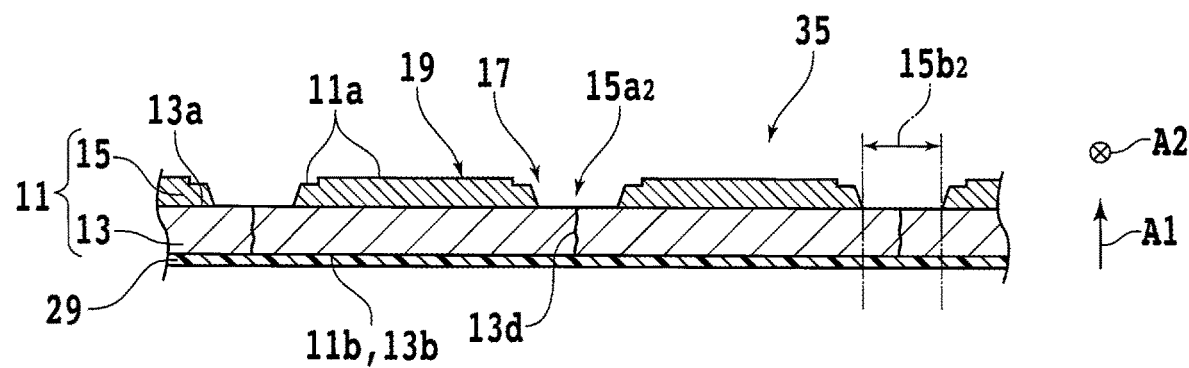
FIG. 11B is an enlarged sectional view of the wafer, the enlarged sectional view depicting laser-processed grooves in a second stage.

FIG. 11B is an enlarged sectional view of the wafer 11, the enlarged sectional view depicting a wide laser-processed groove $15a_2$ formed by applying the second laser beam 50. The third modification also has an advantage of being able to connect the laser-processed groove $15a_2$ and the crack 13d to each other reliably. In addition, the third modification can reduce thermal damage to the substrate 13 at a time of forming the two shallow laser-processed grooves $15a_3$, and can therefore increase the strength of the device chips 35 as compared with the second modification. Incidentally, in addition to the foregoing modifications, the wide laser-processed groove $15a_2$ may be formed in a state in which a plurality of condensing points 50a of the relatively thin laser beam 50 used to form the laser-processed grooves 15a are arranged along a direction intersecting the planned dividing line 17.

The above-described method of manufacturing the device chips 35 brings about effects that the number of times of inverting the wafer 11 upside down in a period from the modified layer forming step S20 to the laser-processed groove forming step S70 can be reduced and that the wafer 11 having the laminate 15 on the front surface 13a of the substrate 13 can be divided reliably along the planned dividing lines 17.

Figure 12:
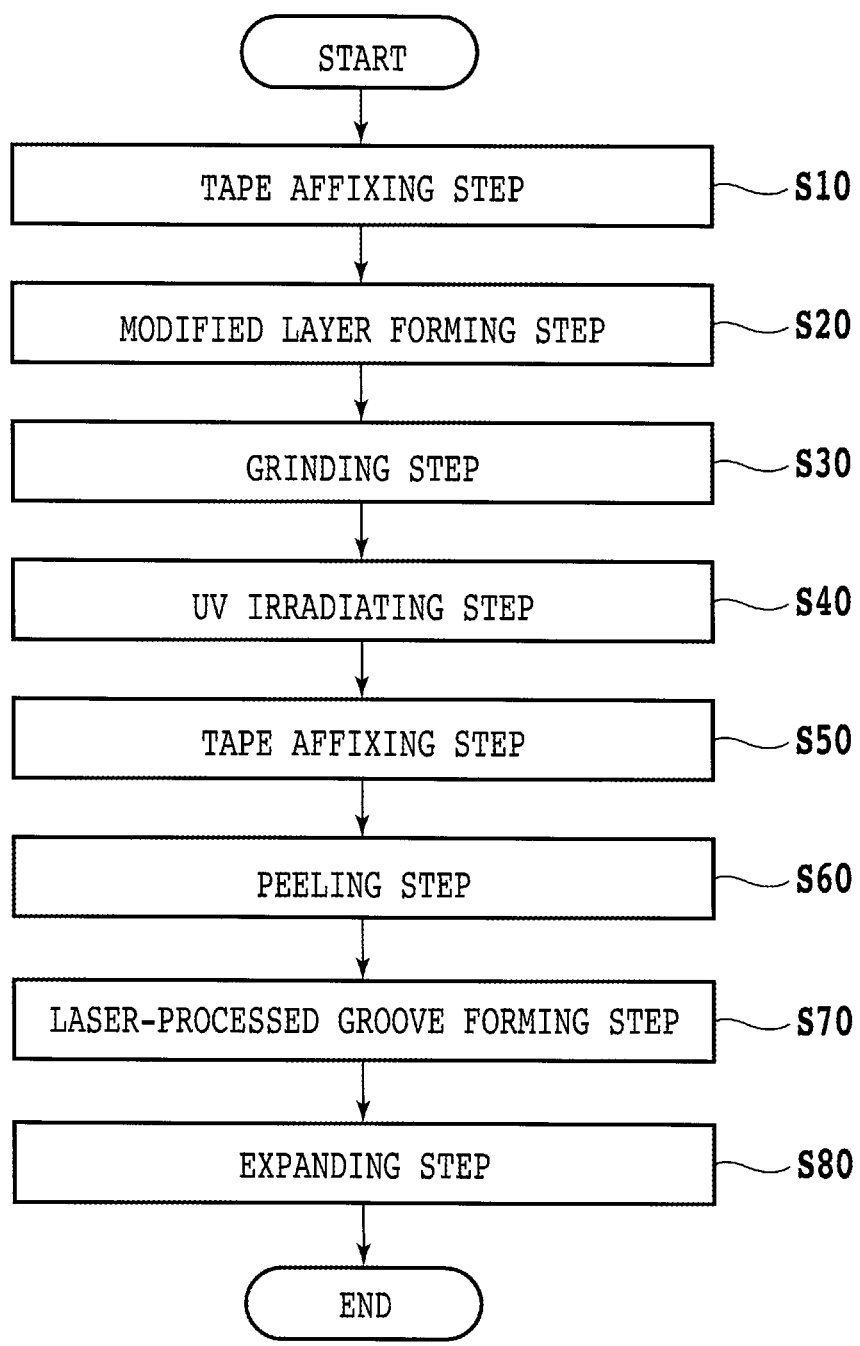
FIG. 12 is a flowchart of a chip manufacturing method according to a second embodiment.
Figure 13:
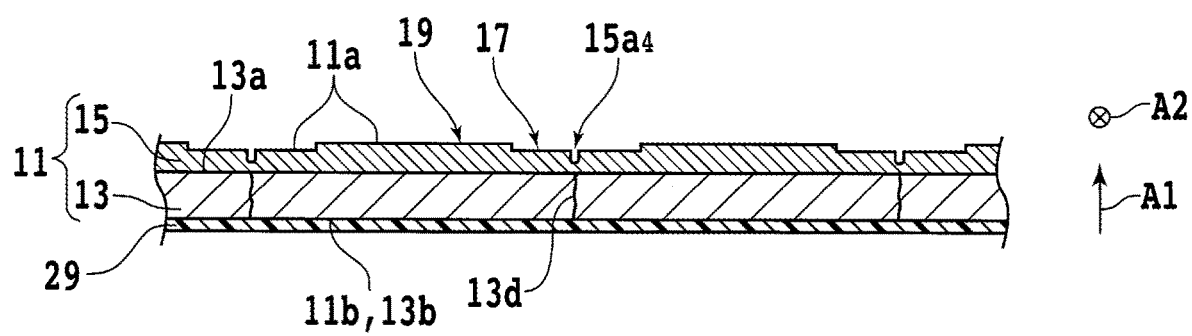
FIG. 13 is an enlarged sectional view of the wafer, the enlarged sectional view depicting laser-processed grooves not reaching a front surface of a substrate.

(Second Embodiment) A second embodiment will next be described. FIG. 12 is a flowchart of a method of manufacturing device chips 35 according to the second embodiment. As depicted in FIG. 13, the laser-processed groove forming step S70 according to the second embodiment forms a laser-processed groove $15a_4$ having a predetermined depth such that the laminate 15 is not severed completely. FIG. 13 is an enlarged sectional view of the wafer 11, the enlarged sectional view depicting one laser-processed groove $15a_4$ not reaching the front surface 13a of the substrate 13. The laser-processed groove $15a_4$ can be formed by, for example, decreasing average power and repetition frequency, increasing processing feed speed, or changing the height position of the condensing point 50a. Damage to the front surface 13a side of the substrate 13 in the laser-processed groove forming step S70 can be reduced by forming the laser-processed groove $15a_4$ not reaching the front surface 13a.

Figure 14A:
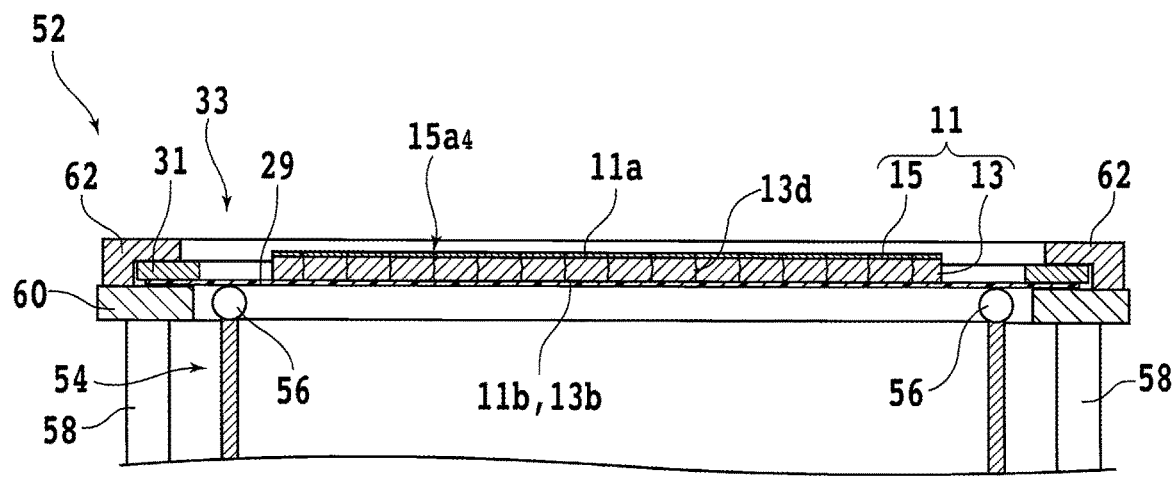
FIG. 14A is a partially sectional side view of an expanding apparatus.

In the second embodiment, after the laser-processed groove forming step S70, an expanding step S80 is performed by using an expanding apparatus 52 that expands the second protective tape 29. FIG. 14A is a partially sectional side view of the expanding apparatus 52. The expanding apparatus 52 has a cylindrical drum 54. An upper end portion of the drum 54 is provided with a plurality of rollers 56 along the circumferential direction of an opening of the drum 54. A plurality of leg portions 58 (three or more leg portions, for example, four leg portions) are arranged on the outside of the drum 54. Incidentally, FIG. 14A depicts two leg portions 58. A lower end portion of each of the plurality of leg portions 58 is provided with an air cylinder (not depicted) for moving the leg portion 58 in an upward-downward direction.

One annular table 60 is disposed on upper end portions of the plurality of leg portions 58. The annular table 60 has a rectangular external shape, and has a circular opening through which the drum 54 can pass. A plurality of clamp mechanisms 62 that each sandwich the annular frame 31 of the wafer unit 33 are arranged on a peripheral portion of the annular table 60.

In the expanding step S80, the upper end portion of the drum 54 and an upper surface of the annular table 60 are arranged at a substantially same height, and then the wafer unit 33 is disposed on the drum 54 and the annular table 60. Then, the annular frame 31 is sandwiched by the plurality of clamp mechanisms 62. Next, the annular table 60 is lowered with respect to the drum 54 by operating the air cylinders. The second protective tape 29 is thereby expanded in a radial direction.

Figure 14B:
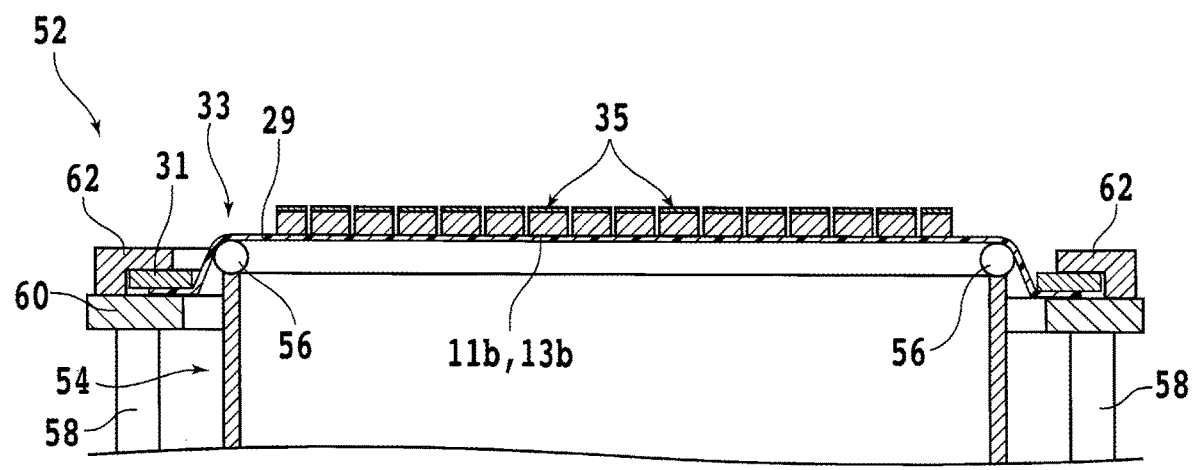
FIG. 14B is a partially sectional side view of the expanding apparatus that has undergone an expanding step.

FIG. 14B is a partially sectional side view of the expanding apparatus 52 that has undergone the expanding step S80. As the second protective tape 29 is expanded, an external force is applied also to the wafer 11 affixed to the second protective tape 29, and the wafer 11 is divided into a plurality of device chips 35 with the cracks 13d and the laser-processed grooves $15a_4$ as a boundary. The second embodiment can divide the wafer 11 into the plurality of device chips 35 by using the expanding apparatus 52 even when the laminate 15 is not completely severed in the laser-processed groove forming step S70. Needless to say, the second embodiment can also reduce the number of times of inverting the wafer 11 upside down, and reliably divide the wafer 11 having the laminate 15 along the planned dividing lines 17.

Incidentally, while the laser-processed groove $15a_4$ does not completely sever the laminate 15 in the second embodiment, the laminate 15 may be severed completely. In addition, while FIG. 13 depicts a case where the crack 13d does not sever the laminate 15, the crack 13d may sever the laminate 15.

In a case where the wafer 11 is already divided into the device chips 35 before the expanding step S80, the expanding step S80 may be performed to facilitate pickup of the device chips 35 by widening intervals between the device chips 35. Besides, structures, methods, and the like according to the foregoing embodiments can be modified and implemented as appropriate without departing from the objective scope of the present invention. For example, also in the first embodiment, the expanding step S80 can be performed after the laser-processed groove forming step S70.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A chip manufacturing method for manufacturing chips by dividing a wafer including a device formed in each region demarcated by a plurality of intersecting planned dividing lines set on a front surface of a substrate and a laminate formed at least on the plurality of planned dividing lines, the chip manufacturing method comprising:

a modified layer forming step of forming a modified layer along the planned dividing lines and forming a crack extending from the modified layer to a front surface side of the substrate by applying, along the planned dividing lines, a first laser beam having a wavelength transmitted through the substrate, in a state in which a back surface side of the substrate is exposed and a condensing point of the first laser beam is positioned within the substrate from the back surface side of the substrate;

a grinding step of thinning the wafer to a predetermined thickness by grinding the back surface side of the substrate exposed in the modified layer forming step, after the modified layer forming step; and a laser-processed groove forming step of forming a laser-processed groove in the laminate by applying, along the planned dividing lines, a second laser beam having a wavelength absorbed by the substrate, from a front surface side of the wafer, after the grinding step.

2. The chip manufacturing method according to claim 1, wherein, in the laser-processed groove forming step, the laser-processed groove is formed in such a manner as to cover the crack extending from the modified layer to the front surface side of the wafer.

3. The chip manufacturing method according to claim 2, wherein, in the laser-processed groove forming step, the laser-processed groove is formed in such a manner as not to divide the laminate completely.

4. The chip manufacturing method according to claim 2, wherein, in the laser-processed groove forming step, the laser-processed groove is formed in such a manner as to divide the laminate completely.

5. The chip manufacturing method according to claim 1, wherein,
in the modified layer forming step, the crack extending to the front surface side of the wafer is formed in such a manner as not to sever the laminate.

6. The chip manufacturing method according to claim 1, wherein,
in the modified layer forming step, the crack extending to the front surface side of the wafer is formed in such a manner as to sever the laminate.

7. The chip manufacturing method according to claim 1, further comprising:
a tape affixing step of affixing a tape having elasticity to the back surface side of the substrate, after the grinding step but before the laser-processed groove forming step; and
an expanding step of expanding the tape affixed to the back surface side of the substrate, after the laser-processed groove forming step.

* * * * *